(12) United States Patent
Sweeney et al.

(10) Patent No.: US 8,476,750 B2
(45) Date of Patent: Jul. 2, 2013

(54) PRINTED CIRCUIT BOARD HAVING EMBEDDED DIES AND METHOD OF FORMING SAME

(75) Inventors: Fifin Sweeney, San Diego, CA (US); Jason R. Gonzalez, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 379 days.

(21) Appl. No.: 12/634,965

(22) Filed: Dec. 10, 2009

(65) Prior Publication Data

US 2011/0140257 A1  Jun. 16, 2011

(51) Int. Cl.
*H01L 25/065* (2006.01)
*H01L 21/98* (2006.01)
*H01L 23/52* (2006.01)

(52) U.S. Cl.
USPC ............................................. 257/686

(58) Field of Classification Search
USPC .. 257/685, 686, 723, 726, E25.031–E25.032, 257/E23.042; 438/6, 28, 66, 67, 107, 109, 438/406, 455–459
See application file for complete search history.

(56) References Cited

U.S. PATENT DOCUMENTS

| | | | |
|---|---|---|---|
| 6,518,655 B2 * | 2/2003 | Morinaga et al. | 257/678 |
| 2006/0125072 A1 | 6/2006 | Mihara | |
| 2006/0278970 A1 | 12/2006 | Yano et al. | |
| 2008/0073797 A1 * | 3/2008 | Kim et al. | 257/777 |
| 2008/0088002 A1 * | 4/2008 | Tseng | 257/686 |
| 2008/0111233 A1 | 5/2008 | Pendse | |
| 2008/0128884 A1 | 6/2008 | Meyer et al. | |
| 2008/0217761 A1 | 9/2008 | Yang et al. | |
| 2008/0248614 A1 * | 10/2008 | Yang et al. | 438/118 |
| 2008/0296056 A1 * | 12/2008 | Kinoshita et al. | 174/261 |
| 2009/0065920 A1 | 3/2009 | Ahn et al. | |
| 2009/0071705 A1 | 3/2009 | Kim et al. | |
| 2009/0127686 A1 * | 5/2009 | Yang et al. | 257/686 |
| 2011/0140257 A1 * | 6/2011 | Sweeney et al. | 257/686 |

OTHER PUBLICATIONS

International Search Report and Written Opinion—PCT/US2010/059891, International Search Authority—European Patent Office—Feb. 16, 2011.

* cited by examiner

*Primary Examiner* — Dao H Nguyen
*Assistant Examiner* — Tram H Nguyen
(74) *Attorney, Agent, or Firm* — Sam Talpalatsky; Nicholas J. Pauley; Joseph Agusta (57) ABSTRACT

A package includes a printed circuit board (PCB) having a first side and a second side and a thickness between the first side and the second side and a stacked die including a top die mounted on a bottom die, the bottom die being at least partially embedded in the PCB. Also a method of forming a package that includes forming an opening in a top surface of the PCB layer, placing a stacked die including a top die stacked on a bottom die into the opening, laminating the PCB layer to form a laminate layer, and forming an electrical connection with the stacked die.

7 Claims, 7 Drawing Sheets

CAVITY FORMATION

FIG. 1A
(CONVENTIONAL ART)

TAPE ATTACHING

FIG. 1B
(CONVENTIONAL ART)

DIE PLACING

FIG. 1C
(CONVENTIONAL ART)

PLASMA CLEANING

PRINTED CIRCUIT BOARD HAVING EMBEDDED DIES AND METHOD OF FORMING SAME

FIELD OF DISCLOSURE

Disclosed embodiments are related to a package including first and second embedded dies and toward a method of forming a package having first and second embedded dies, and, more specifically, to a package including a layer of printed circuit board (PCB) material having first and second embedded, stacked, dies and toward a method of forming a package including a layer of PCB material having first and second embedded, stacked, dies.

BACKGROUND

Die stacking involves mounting one or more chips on another chip in a single semiconductor package. This process can increase the amount of circuitry that can be housed within a package of a given size, and thus reduces the real estate taken up on a printed circuit board by a chip. Die stacking may also simplify the assembly of printed circuit boards since multiple dies may be attached to a printed circuit board in a single operation. Die stacking also has the potential to improve the electrical performance of devices in which it is used since the interconnections between elements on each of the stacked dies may be shorter than the interconnections that would be required to connect the die elements on a planar surface. This can result in faster signal propagation and may also reduce cross-talk.

While die stacking provides the above benefits, and others, it may also increase the thickness of a given printed circuit board (PCB) or package. In some applications the thickness of a package including the stacked die may be greater than the height available for mounting the package. In those situations, it may be necessary to redesign the product in which the stacked die is to be used or forego the benefits of die stacking. It would be desirable to provide a solution to the above problem which would expand the range of environments in which packages having stacked dies could be used.

SUMMARY

Exemplary embodiments are directed to apparatuses and methods for forming a package. One aspect comprises a method of forming a package that includes forming an opening in a top surface of a printed circuit board (PCB) layer, placing a stacked die comprising a top die stacked on a bottom die into the opening, laminating the PCB layer to form a laminate layer, and forming an electrical connection with the stacked die.

Another aspect comprises a package that includes a PCB having a first side and a second side and a thickness between the first side and the second side and a stacked die comprising a top die mounted on a bottom die, the bottom die being at least partially embedded in the PCB.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Aspects are disclosed in the following description and related drawings directed to specific embodiments. Alternate embodiments may be devised without departing from the scope of the invention. Additionally, well-known elements will not be described in detail or will be omitted so as not to obscure the relevant details of the disclosed embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequences of actions described herein can be considered to be embodied entirely within any form of computer readable storage medium having stored therein a corresponding set of computer instructions that upon execution would cause an associated processor to perform the functionality described herein. Thus, the various aspects of the embodiments may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1A:
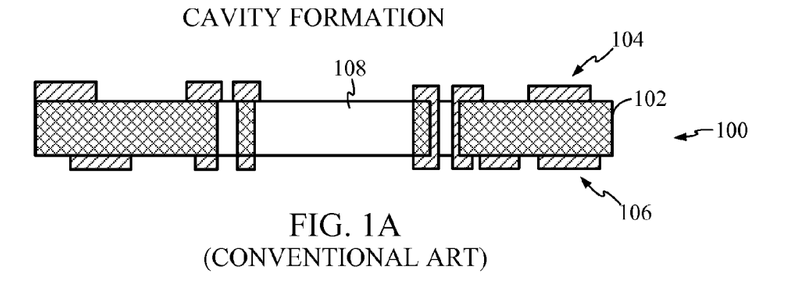
FIGS. 1A-1H are sectional side elevational views schematically illustrating a convention method of embedding a die in a printed circuit board (PCB).
Figure 1B:
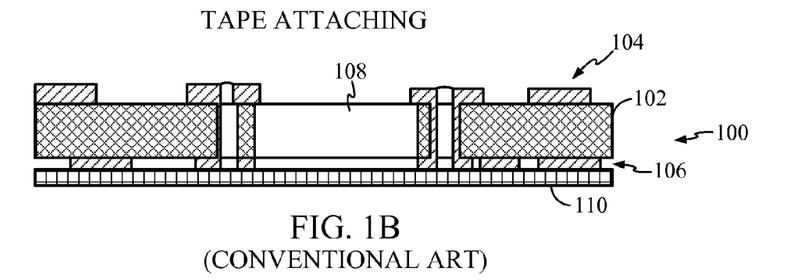
Figure 1C:
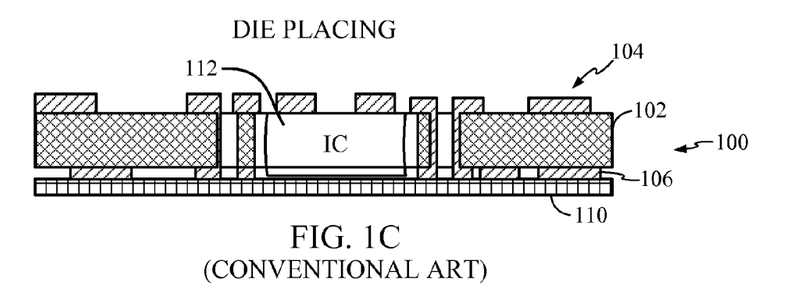
Figure 1D:
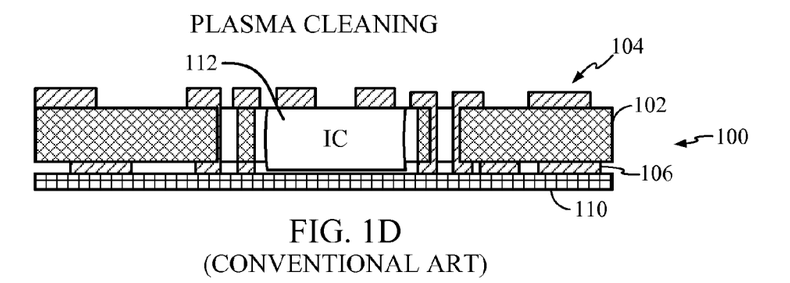
Figure 1E:
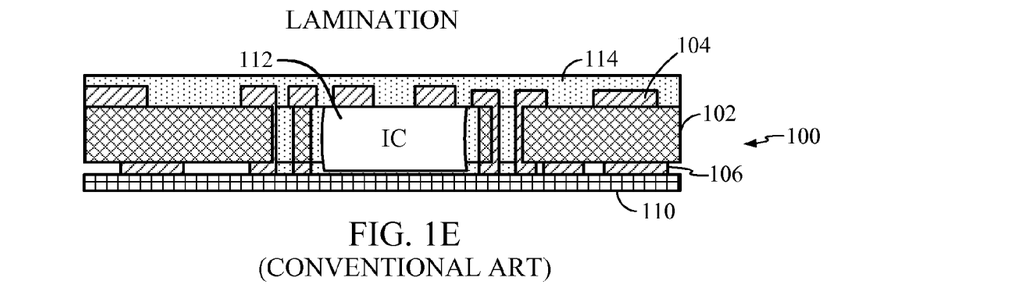
Figure 1F:
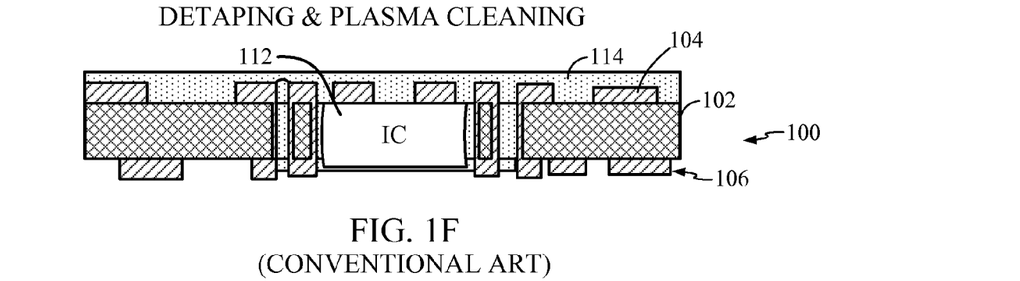
Figure 1G:
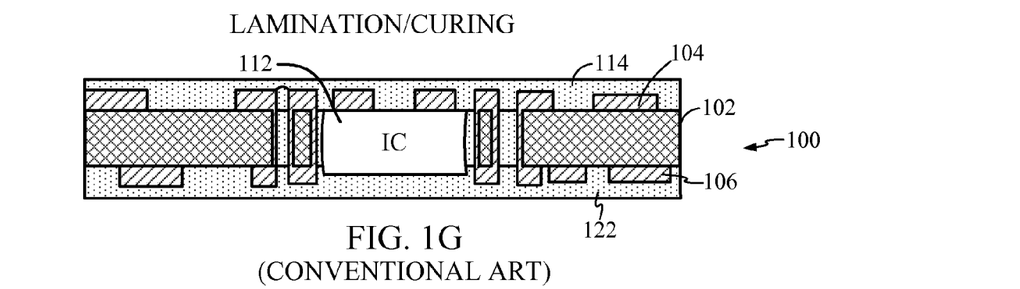
Figure 1H:
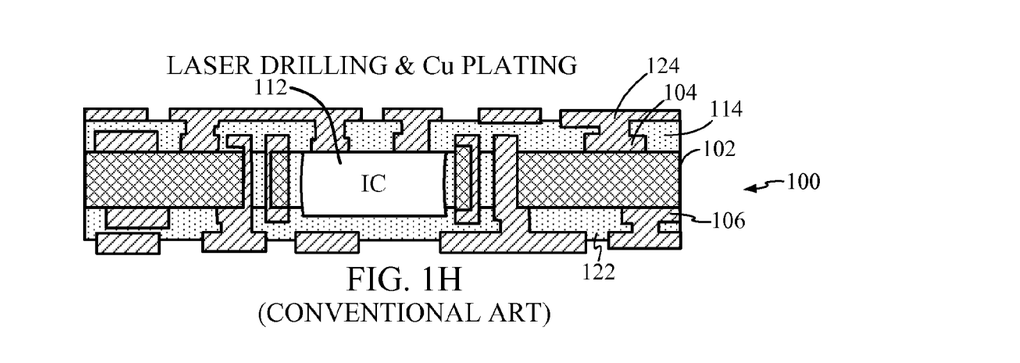

FIGS. 1A-1H illustrate a process of forming a conventional substrate, such as a printed circuit board (PCB) that includes a single embedded die. FIG. 1A illustrates a PCB 100 having a dielectric layer 102, a top conductive layer 104 and a bottom conductive layer 106. As used herein, "top" and "bottom" and other relative terms refer to the orientation of various elements as illustrated in the drawings, it being understood that the subject device may be used in various other orientations. The top and bottom conductive layers 104, 106 are etched, as is known in the art, to form desired conductive patterns thereon, and therefore only portions of the top and bottom conductive layers 104 and 106 are visible in the sectional views of FIGS. 1A-1H. A cavity 108 is formed in the PCB 100, and, as illustrated in FIG. 1B, a tape layer 110 is placed over the bottom conductive layer 106 over one end of the cavity 108. FIG. 1C illustrates a die 112 resting in the cavity 108 on the tape layer 110. After plasma cleaning, as illustrated in FIG. 1D, the PCB 100 is laminated (FIG. 1E) to provide a top laminate layer 114 covering the top conductive layer 104 and surrounding the die 112 to seal the die 112 in the cavity 108. FIG. 1F illustrates the tape layer 110 removed from the bottom conductive layer 106 of the PCB 100 after which the exposed portion of PCB 100 is plasma cleaned, and a bottom laminate layer 122 is formed over the bottom conductive layer 106 of the PCB 100 as shown in FIG. 1G. After suitable curing, the package formed by the PCB 100 and the top and bottom laminate layers 114, 122 is laser drilled and copper plated, as illustrated in FIG. 1H, to form suitable electrical connections between the die 112 and traces 124 formed on the top laminate layer 114.

Figure 2:
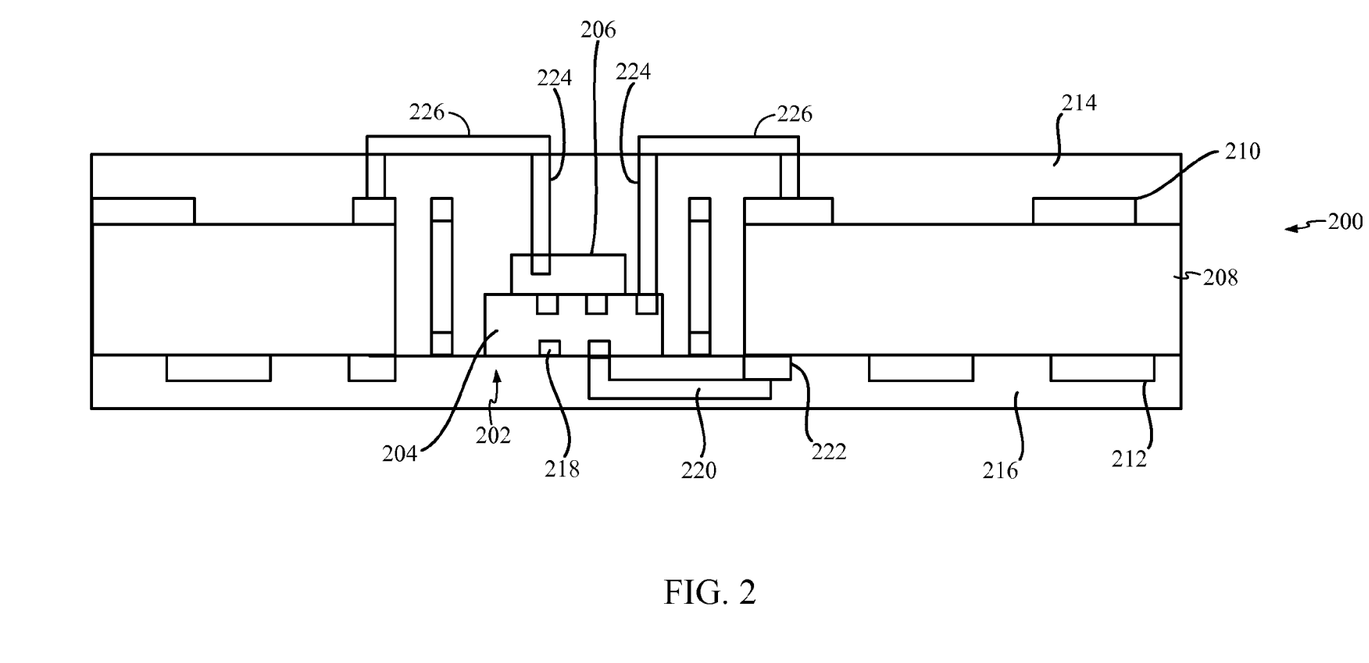
FIG. 2 is a sectional side elevational view of a PCB having an embedded, stacked die.

The thickness of a given package that includes a stacked die can be reduced if the stacked die is partially or completely embedded in a PCB substrate. In this manner, the benefits of die stacking can be obtained in environments where it was previously not possible to fit a package that included a stacked die. FIG. 2 illustrates an embodiment including a PCB substrate 200 having a stacked die 202 embedded therein, the stacked die 202 comprising a bottom die 204 and a top die 206 stacked thereon. The PCB substrate 200 comprises a dielectric layer 208, a top conductive layer 210 and a bottom conductive layer 212. A top laminate layer 214 covers the top conductive layer 210 and surrounds the stacked die 202, while a bottom laminate layer 216 covers the bottom conductive layer 212 and seals the stacked die 202 in the substrate 200. The package is formed in substantially the same manner as conventional single die packages discussed above. For stacked dies wherein the bottom die 204 includes bottom contacts 218 which previously might have been connected to a ball grid array on a circuit board, traces 220 may be provided for electrically connecting these bottom contacts 218 to traces 222 on bottom conductive layer 212. In addition, vias 224 may be laser drilled through the top laminate layer 214 to connect the top die 202 or the bottom die 204 to traces 226 on the surface of top laminate layer 214. This arrangement provides for increased flexibility in die design and the layout of interconnections while at the same time reducing die thickness as discussed above.

Figure 3:
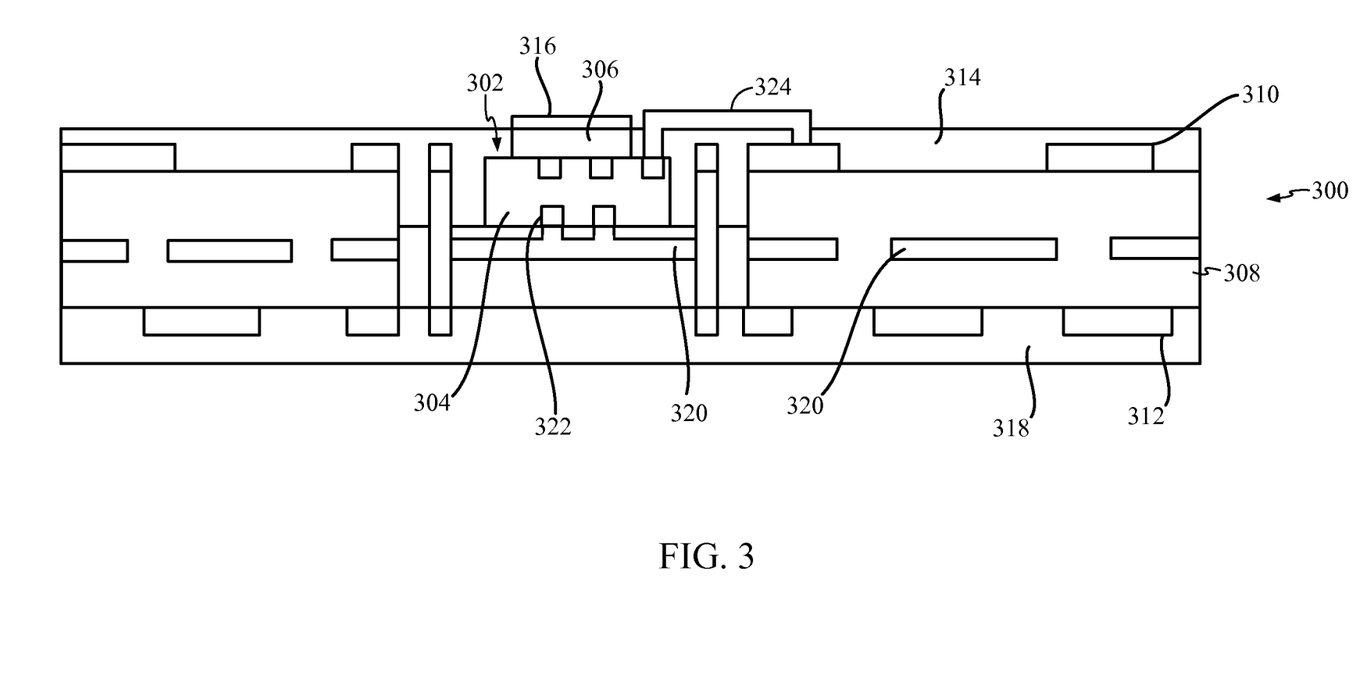
FIG. 3 is a sectional side elevational view of a PCB having an embedded, stacked die.

FIG. 3 illustrates an embodiment in which a PCB 300 has a stacked die 302 at least partially embedded therein, the stacked die 302 comprising a bottom die 304 and a top die 306. The PCB 300 includes a dielectric layer 308, a top conductive layer 310 and a bottom conductive layer 312. A top laminate layer 314 covers the top conductive layer 310 and substantially surrounds the stacked die 302, although in this embodiment, at least a top portion 316 of the top die 306 protrudes from the top of the top laminate layer 314. The PCB 300 further includes a bottom laminate layer 318 and at least one internal conductive layer 320. The package is formed in substantially the same manner as the conventional single die package described above except that the cavity into which the stacked die 302 is placed does not extend all the way through the PCB 300 and thus the tape layer discussed above in connection with the conventional process is not required since the bottom of cavity can provide physical support for the stacked die. Contacts 322 on the bottom of the bottom die 304 may be electrically connected to the internal conductive layer 320. Other connections between the bottom die 304 and the top conductive layer 310 can be formed by laser drilling the top laminate layer 316 and forming suitable traces 324 on the surface of the top laminate layer 316. Leaving all or a portion of the top die 306 exposed may be beneficial when the top die 306 comprises an analog die and generates or receives RF transmissions which may be affected if the top die 306 were embedded in the top laminate layer 316.

Figure 4:
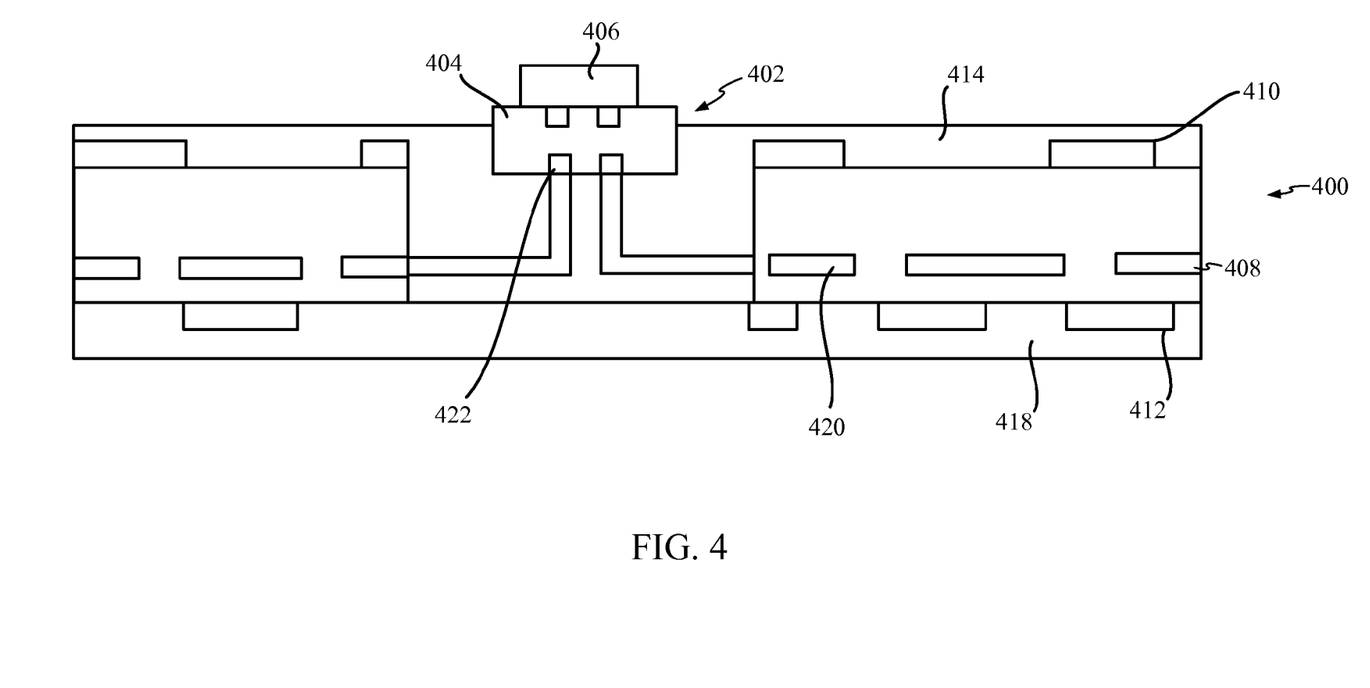
FIG. 4 is a sectional side elevational view of a PCB having an embedded, stacked die.

FIG. 4 illustrates an embodiment in which a PCB 400 having a stacked die 402 embedded therein, which stacked die 402 comprises a bottom die 404 and top die 406. In this embodiment, the entire top die 406 is mounted outside the PCB 400 and a portion of the bottom die 404 projects from the PCB 400 as well. PCB 400 includes a dielectric layer 408, a top conductive layer 410 and a bottom conductive layer 412. A top laminate layer 414 covers the top conductive layer 410 and substantially surrounds the bottom die 404, although in this embodiment, the top die 406 and a portion of the bottom die 404 protrude from the top of the top laminate layer 414. The PCB 400 further includes a bottom laminate layer 418 and at least one internal conductive layer 420. The package is formed in substantially the same manner as the conventional single die package described above except that the cavity into which the stacked die 402 is placed does not extend all the way through the PCB 400 and thus the tape layer discussed above in connection with the conventional process is not required since the bottom of cavity can provide physical support for the stacked die. Contacts 422 on the bottom of the bottom die 404 may be electrically connected to the internal conductive layer 420.

Leaving the top die 406 exposed may be beneficial when the top die 406 comprises an analog die and generates or receives RF transmissions which may be affected if the top die 406 were embedded in the top laminate layer 416. Leaving a portion of the bottom die 404 exposed may be beneficial when it is desirable to leave the connections between the bottom die 404 and the top die 406 accessible, when it might be necessary to replace the top die 406 while leaving the bottom die 404 in place for example. Alternately, this arrangement provides benefits when the real estate beneath the die mounting location is needed for other connections. However, in some applications, sufficient clearance may be available that embedding a portion of the bottom die 404 in the PCB reduces the thickness of the PCB package sufficiently to allow a stacked die arrangement to be used where previously insufficient clearance existed.

Figure 5:
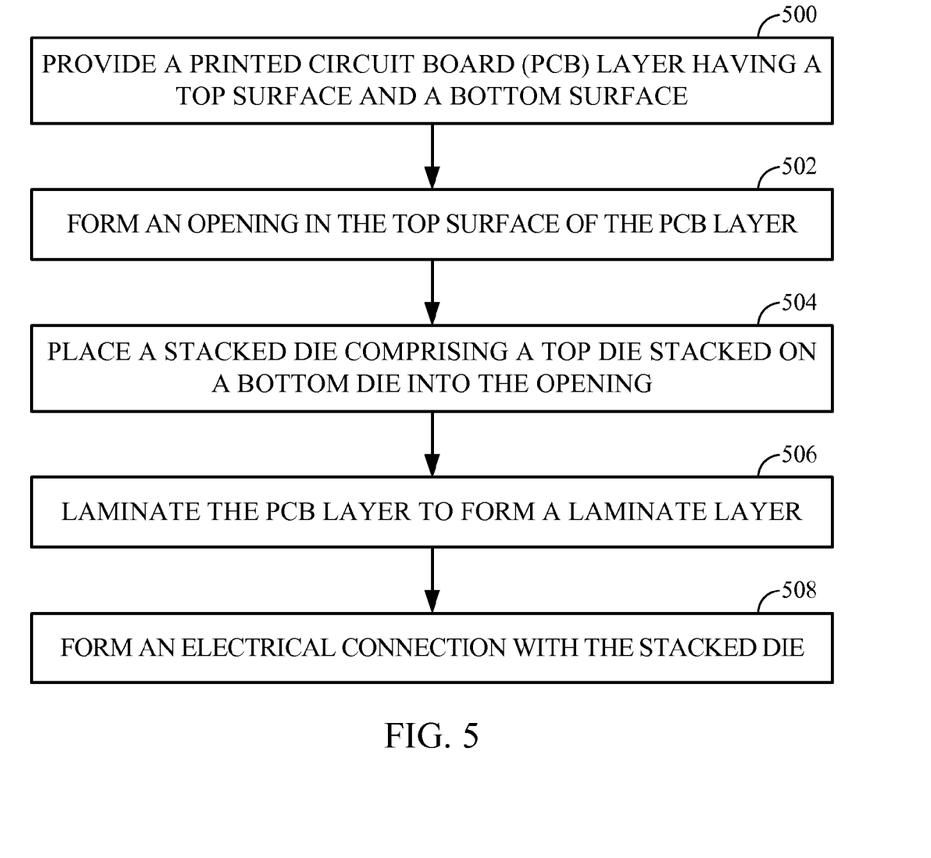
FIG. 5 is a flow chart illustrating a method according to an embodiment.

A method of forming a package according to an embodiment is illustrated in FIG. 5 and includes a block 500 of providing a printed circuit board (PCB) layer having a top surface and a bottom surface, a block 502 of forming an opening in the top surface of the PCB layer, a block 504 of placing a stacked die comprising a top die stacked on a bottom die into the opening, a block 506 of laminating the PCB layer to form a laminate layer, and a block 508 of forming an electrical connection with the stacked die.

Figure 6:
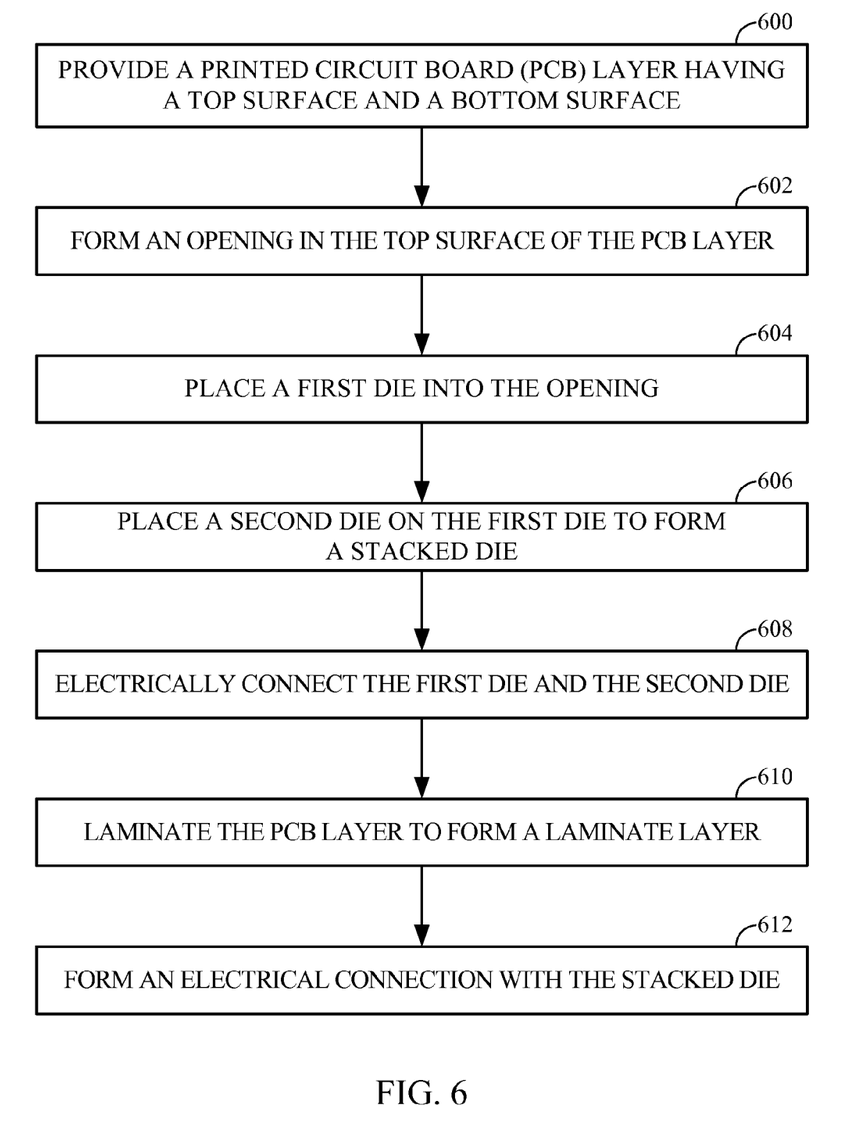
FIG. 6 is a flow chart illustrating a method according to another embodiment.

A method according to another embodiment is illustrated in FIG. 6 and includes a block 600 of providing a printed circuit board (PCB) layer having a top surface and a bottom surface, a block 602 of forming an opening in the top surface of the PCB layer, a block 604 of placing a first die into the opening and a block 606 of placing a second die on the first die to form a stacked die. The method also includes a block 608 of electrically connecting the first die and the second die, a block 610 of laminating the PCB layer to form a laminate layer, and a block 612 of forming an electrical connection with the stacked die.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the invention.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM, a solid state memory device, such as a flash-drive, or other optical disk storage, magnetic disk storage or other magnetic storage devices, or any other medium that can be used to carry or store desired program code in the form of instructions or data structures and that can be accessed by a computer. Also, any connection is properly termed a computer-readable medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

It will be appreciated that packages as illustrated for example in FIGS. 2-4 may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes a semiconductor package having stacked dies.

The foregoing disclosed devices and methods may be designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of embodiments may be described or claimed in the singular, the plural is contemplated unless limitation to the singular is explicitly stated.

What is claimed is:

1. A method of forming a package comprising:
   forming an opening in a top surface of a printed circuit board (PCB) layer;
   fabricating a stacked die comprising a top die stacked on a bottom die in the opening, wherein contacts for electrical connection are located on the bottom surface of the bottom die;
   laminating the PCB layer to form a laminate layer, wherein the laminate layer is a top laminate layer formed on the top surface, and wherein at least a portion of the top die protrudes from a top surface of the laminate layer in an upward direction; and
   forming an electrical connection with the stacked die.

2. The method of claim 1, wherein at least part of the bottom die protrudes from the top surface of the laminate layer in the upward direction.

3. The method of claim 1 wherein forming an electrical connection with the stacked die comprises forming a via through the laminate layer and connecting the via to a trace on a top surface of the laminate layer.

4. The method of claim 1 wherein forming an electrical connection with the stacked die comprises electrically connecting contacts on the bottom surface of the bottom die to an internal conductive layer of the PCB.

5. The method of claim 1 wherein forming an electrical connection with the stacked die comprises:
   forming a via through the laminate layer and connecting the via to a trace on a top surface of the laminate layer; and
   electrically connecting the stacked die to an internal conductive layer of the PCB.

6. The method of claim 1, wherein fabricating comprises:
   placing the bottom die into the opening;
   placing the top die on the first die to form the stacked die; and
   electrically connecting the first die and the second die.

7. The method of claim 1 further comprising connecting electrical contacts on the top surface of the top die to the top conductive layer.

* * * * *